United States Patent
Speaker et al.

(10) Patent No.: US 10,772,246 B2
(45) Date of Patent: Sep. 8, 2020

(54) ADDITIVE MANUFACTURING FOR SHIELDING NEUTRON AND PHOTON RADIATION

(71) Applicant: Southwest Research Institute, San Antonio, TX (US)

(72) Inventors: Daniel P. Speaker, San Antonio, TX (US); Albert J. Parvin, Jr., San Antonio, TX (US); Nathan B. Hall, Annapolis, MD (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 16/189,234

(22) Filed: Nov. 13, 2018

(65) Prior Publication Data

US 2020/0154617 A1    May 14, 2020

(51) Int. Cl.
| | |
|---|---|
| *H05K 9/00* | (2006.01) |
| *B29C 64/135* | (2017.01) |
| *B33Y 70/00* | (2020.01) |
| *B33Y 10/00* | (2015.01) |
| *B29K 55/02* | (2006.01) |
| *B29K 509/04* | (2006.01) |
| *B29K 505/08* | (2006.01) |

(52) U.S. Cl.
CPC ......... *H05K 9/0081* (2013.01); *B29C 64/135* (2017.08); *B29K 2055/02* (2013.01); *B29K 2505/08* (2013.01); *B29K 2509/04* (2013.01); *B29K 2995/0011* (2013.01); *B33Y 10/00* (2014.12); *B33Y 70/00* (2014.12)

(58) Field of Classification Search
CPC .... H05K 9/0081; B29C 64/135; B33Y 10/00; B33Y 70/00; B29K 2055/02; B29K 2505/08; B29K 2509/04; B29K 2995/0011

USPC ......... 250/506.1, 507.1, 515.1, 516.1, 517.1, 250/518.1, 519.1
See application file for complete search history.

(56) References Cited

U.S. PATENT DOCUMENTS

| | | | |
|---|---|---|---|
| 6,900,383 B2 | 5/2005 | Babb et al. | |
| 10,074,449 B2 * | 9/2018 | White | B33Y 30/00 |
| 2015/0048209 A1 * | 2/2015 | Hoyt | B33Y 80/00 |
| | | | 244/131 |
| 2016/0289468 A1 | 10/2016 | Turner | |

(Continued)

FOREIGN PATENT DOCUMENTS

CN    107603117 A    1/2018

OTHER PUBLICATIONS

Caffrey, J., An Abstract of the Dissertation "Radiation Shielding for Space Nuclear Propulsion" Oregon State University, presented Jan. 9, 2017, 168 pgs Citeable URL: <<https://ir.library.oregonstate.edu/concern/graduate_thesis_or_dissertations/bc386n82z>>.

(Continued)

*Primary Examiner* — Nicole M Ippolito
(74) *Attorney, Agent, or Firm* — Grossman, Tucker, Perreault & Pfleger, PLLC

(57) ABSTRACT

The present invention relates to the use of additive manufacturing as applied to radiation shielding. In particular, additive manufacturing formulations are described which provide shielding for neutron and photon radiation and which can extend the useful operation life of remote sensing devices utilized to conduct surveillance and inspection work where such radiation fields are present.

16 Claims, 2 Drawing Sheets

(56) References Cited

U.S. PATENT DOCUMENTS

2018/0221830 A1* 8/2018 Larson .................. H01J 5/18
2019/0010611 A1* 1/2019 Wilds .................. G01N 17/00
2019/0108923 A1* 4/2019 Anderson ............. G21K 1/046
2019/0143141 A1* 5/2019 Liu ...................... A61N 5/10
                                                              600/1

OTHER PUBLICATIONS

Courtland, R., "Radiation Hardening 101: How to Protect Nuclear Reactor Electronics." IEEE Spectrum. Mar. 2011, 2 pgs <<https://spectrum.ieee.org/tech-talk/semiconductors/design/radiationhardening-101>> accessed Apr. 2018.

Fetahovic, I., et al "Radiation Damage in Electronic Memory Devices." International Journal of Photoenergy. May 2013; 6 pgs.

GTP Powder Perfect™ Tungsten, Tungsten Carbide and Molybdenum Powders for Additive Manufacturing; 4 pgs <<https://www-globaltungsten-com.azureedge.net/fileadmin/user_upload/home/Products/AM_Brochure_-_Draft_low_res_.pdf>> accessed Nov. 2018.

LA-UR-03-1987; "MCNP—A General Monte Carlo N-Particle Transport Code, Version 5." Los Alamos, New Mexico: Los Alamos National Laboratory. Apr. 24, 2003 (Revised Feb. 1, 2008), 416 pgs <<https://laws.lanl.gov/vhosts/mcnp.lanl.gov/pdf_files/la-ur-03-1987.pdf>> accessed Apr. 2018.

Olsson A., et al; "New Possibilities Using Additive Manufacturing with Materials That Are Difficult to Process and With Complex Structures", Open Access Publishing, Royal Swedish Academy of Sciences, Physica Scripta 92, 2017, 053002, 9pgs.

Speaker, D., et al; Advancing the Survivability of Unmanned Systems in High Radiation Environments; Transactions of the American Nuclear Society, vol. 119, Orlando, FL, Nov. 11-15, 2018; Robotic Inspection and Survey in Radiation Environments; pp. 1343-1346.

Viskadourakis, Z., et al, "Electromagnetic Shielding Effectiveness of 3D Printed Polymer Composites", Applied Physics A, Dec. 2017 123:736; Published on-line Nov. 7, 2017 (8 pgs).

* cited by examiner

ADDITIVE MANUFACTURING FOR SHIELDING NEUTRON AND PHOTON RADIATION

FIELD

The present invention relates to the use of additive manufacturing as applied to radiation shielding. In particular, additive manufacturing formulations are described which provide shielding for neutron and photon radiation and which can extend the useful operation life of remote sensing devices utilized to conduct surveillance and inspection work where such radiation fields are present.

BACKGROUND

Within the nuclear industry, an area of interest is in the use of remote sensing devices such as robotics and aerial drones to conduct surveillances and inspection where radiation fields are present. These radiation fields may be intense, where humans cannot safely enter and/or work for extended periods. In cases where the radiation fields are not as intense, use of robotics or aerial drones can reduce human exposures, helping meet as-low-as-reasonably-achievable objectives. Extended radiation exposure of sensitive electronics such as those using semiconductor materials can cause these devices to malfunction or stop working more frequently than those not exposed. Radiation can ionize and disrupt a semiconductor's crystal structure, introducing a variety of failure modes for electronic devices. Depending on the energy and type, radiation can cause many difficulties for sensitive electronics, including but not limit to physical damage. For example, in metal-oxide-semiconductor devices, gamma and X-ray radiation will strip electrons off atoms in an insulator to create electron-hole pairs, resulting in trapped positive changes that can shift device operating characteristics. Increasing the robustness of electronics to survive in radiation environments has involved processing techniques commonly referred to as radiation hardening. Presently, manufacturing techniques applied to increase the resistance to radiation effects involve constructing electronics with fewer defects, and semiconductor doping.

Traditional electronics radiation hardening typically entails enclosing the entire electronic circuit board or area with a dense material (e.g., lead or tungsten), adding significant weight to the system. Also, this method takes a brute-force approach by shielding all the electronics, including components not sensitive to radiation. Thus, traditional electronics radiation shielding is rarely spaced optimized and can add significant weight and complexity to the system it is shielding. Both weight and size are relatively important feature considerations on any subsystem to be added to a robotics platform, especially aerial drones.

Accordingly, a need remains to provide for improved radiation resistance which improves upon current methods and which can avoid traditional radiation hardening procedures that may be utilized in remote sensing devices exposed to radiation environments such as decommissioning equipment, surveillance robots and unmanned systems (crawlers, drones and submersibles).

SUMMARY

A method for making a radiation shielding component comprising providing resin material, a metal selected from W, Pb, Sn or Sb, and $B_4C$. The resin, metal and $B_4C$ are combined and deposited in successive layers in a 3D printer to form an additively manufactured (AM) component wherein the printed component provides shielding for both neutron and photon based radiation. The AM component may protect mechanical and electrical components in a variety of remote sensing devices that may be employed to conduct surveillance and inspection where radiation fields are present.

DETAILED DESCRIPTION

Figure 1:
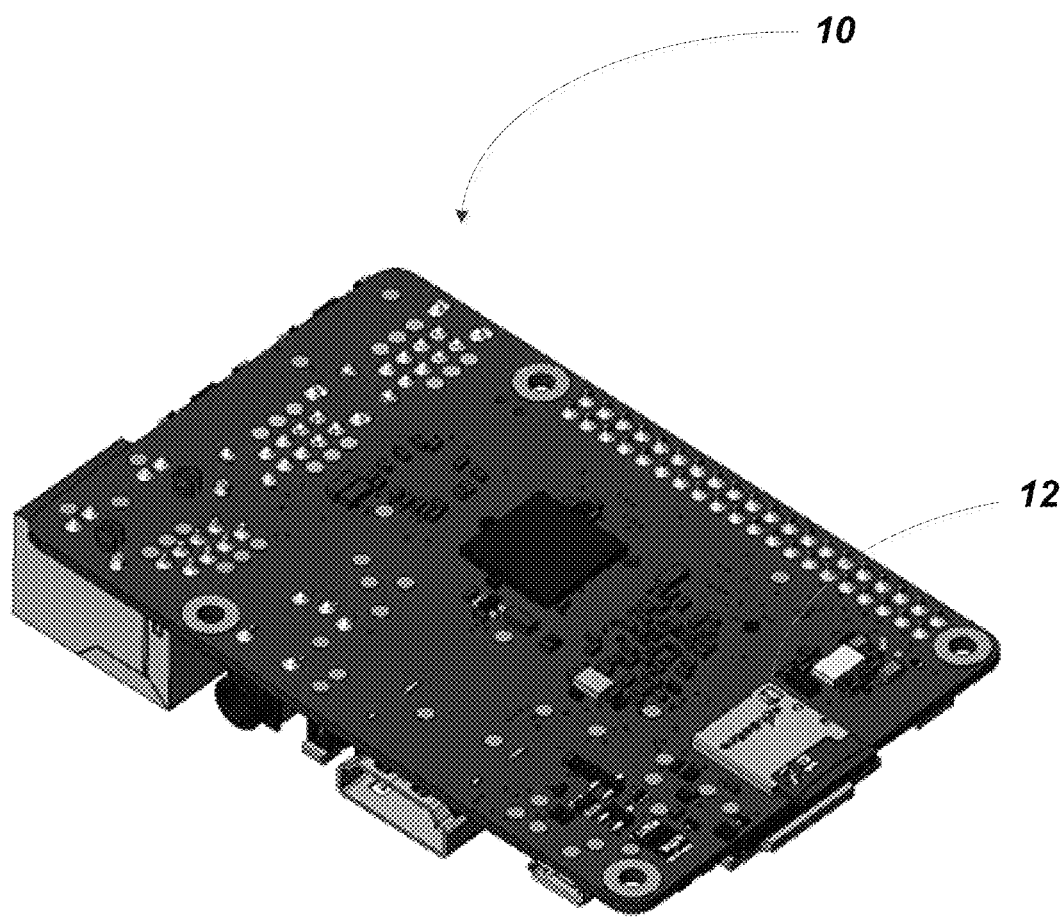
FIG. 1 illustrates an exemplary printed circuit board containing a critical component (memory card) susceptible to the effects of radiation.

The present invention is directed at the use of additive manufacturing shielding for radiation sensitive devices that have been exposed to neutron or photon radiation. In particular, such radiation may be sourced from nuclear fuel that is used for power generation or research purposes in a nuclear facility. Once a susceptible component is identified, a shield may now be produced using additive manufacturing procedures, which may be targeted to a selected location on the component, thereby providing protection at a relatively reduced size and weight.

Additive manufacturing herein is reference to a 3D printing procedure that relies upon a layer-by-layer process to build any desired product configuration. Each layer may have a thickness of 50 μm to 100 μm. A desired design for the product configuration may be conveniently created by software which allows a user to electronically create the desired product configuration in electronic fashion. Such software is typically identified as computer-aided drafting or CAD software. The electronic drawing of the selected product configuration is then converted into instructions for the 3D printer to create the component. It is contemplated herein that such 3D printers may include any printer in which materials are joined and solidified to provide a 3D object. A variety of 3D printing processes are available, including but not limited to fused filament fabrication, where the part is formed by extruding filaments of material through a heating moving head that melts and extrudes the material depositing it, layer by layer, in the form of a desired shape. In addition, the present invention contemplates the use of selective laser sintering that relies upon a laser as the power source to sinter powder material and binding the material together to form a solid structure. In addition, it is contemplated that other methods may be employed such as stereolithography where a light emitting device selectively illuminates the transparent bottom of a tank filled with liquid photo-polymerizing resin. The solidified resin is then progressively moved upwards until the 3D object is complete.

Resins that are suitable for 3D printing herein include thermoplastic materials (one or more polymer resins that can be heated and shaped more than once), examples of which include acrylonitrile-butadiene-styrene terpolymer (ABS), polycarbonate (PC), poly(methylmethacrylate), polyphenylene sulfone (PPSU), polyethylene, polyetherimide (PEI), polyether ether ketone (PEEK) and polystyrene. In the case where photopolymerization may be utilized, one preferably employs as the resin those monomers that can be activated and converted into polymeric structure, such as monomers based upon acrylates or methacrylates.

The above referenced additive manufacturing resins or monomers are now combined with radiation shield materials. Such radiation shielding materials combine boron carbide ($B_4C$) with a metal component, such as tungsten (W), lead (Pb), tin (Sn) or antimony (Sb). However, in the present invention, the preferred metal component is tungsten. Accordingly, in the broader context of the present invention, the resin component utilized in the additive manufacturing procedure may be preferably present at a level of 50% (vol.) to 80% (vol.). The level of $B_4C$ may be present at a level of 10% (vol.) to 40% (vol.), more preferably at a level of 15% (vol.) to 35% (vol.), and even more preferably, 20% (vol.) to 30% (vol.). The metal, preferably tungsten, may be present at a level of 1% (vol.) to 30% (vol.), more preferably 2% (vol.) to 20% (vol.). In all of the aforementioned embodiments, the additive manufacturing resin is preferably selected at a percentage that makes up the balance of the formulation (i.e., to provide formulation where the resin, metal component and $B_4C$ preferably add up to 100% (vol.). However, it should be noted that the percent by weight of the resin component may be adjusted so that the formulation may include other components, including but not limited to colorants, adhesion promotors, crosslinking agents, fillers, binders, fibers, coatings, nanoparticles and other additives that can be made to influence the mechanical properties of the final additive manufactured part. It is contemplated that such other components may be preferably present at a level of up to 10% (vol.).

For example, a particularly preferred formulation herein may therefore include any one of the following three (3) formulations: (1) 60% (vol.) resin (ABS); 20% (vol.) $B_4C$; 20% (vol.) W; (2) 60% (vol.) ABS, 30% (vol.) $B_4C$, 10% (vol.) W; (3) 68% (vol.) (ABS); 30% (vol.) $B_4C$, 2% (vol.) W. In any of the foregoing, the metal may again be any one of W, Pb, Sn or Sb and the resins may be any one of the resins noted herein suitable for additive manufacturing procedures.

Table 1 below identifies the shielding materials that were considered herein:

TABLE 1

Shielding Materials

| Basic Material Properties | Properties | Density ($g/cm^3$) | Properties |
|---|---|---|---|
| Tungsten at 95 TD | W at 95% TD | 18.34 | Bulk metal, relatively hard to form and machine |
| Aluminum-6061 | Al-6061 | 2.7 | Additive manufacturing material |
| Titanium alloy | Ti—6Al—4V | 4.43 | Titanium alloy |
| 60% ABS 20% $B_4C$ 20% W (By Volume) | Additive Manufacturing Material (With 20% $B_4C$ and 20% W) | 4.8 | ABS, tungsten and boron carbide |
| 60% ABS 30% $B_4C$ 10% W (By Volume) | Additive Manufacturing Material (With 30% $B_4C$ and 10% W) | 3.21 | Lower tungsten amount to decrease density |
| 68% ABS 30% $B_4C$ 2% W (By Volume) | Additive Manufacturing Material (With 30% $B_4C$ and 2% W) | 1.83 | Lowest tungsten amount to decrease density |
| Stainless Steel-316 | SS-316 | 8.03 | Used as a basis of comparison |
| 100% ABS | All ABS | 1.04 | Thermoplastic polymers family. 3D printing, which is done using primarily FDM or FFF 3D printers |
| Vermiculite | Vermiculite | 2.55 | Used for insulation of crucible, as such very temperature resistant, high hydrogen content |
| $B_4C$ | Boron carbide | 2.52 | |

FDM—Fused Deposition Modeling
FFF—Fused Filament Fabrication
ABS—Acrylonitrile Butadiene Styrene
TD—Theoretical Density Tables 2 and 3 below illustrate the shielding effectiveness of the contemplated formulations as confirmed by use of a shielding program that relies upon Monte Carlo N-Particle (MCNP) code that can be used for neutron, photon, electron or coupled neutron/photon/electron transport to calculate shielding effectiveness based upon thickness and sample characteristics. See, *MCNP—A General Monte Carlo N-Particle Transport Code*, Version 5, LA-UR-03-1987, Los Alamos, N. Mex.: Los Alamos National Laboratory, April 2003. In Tables 2 and 3 below, the results are in terms of percentage of radiation that survives after radiation emits through the shielding at the indicated thickness.

TABLE 2

Shielding Results For Neutrons

| Shielding Thickness (cm) | 60% (vol.) ABS 20% (vol.) B4C 20% (vol.) W | 60% (vol.) ABS 30% (vol.) B4C 10% (vol.) W | 68% (vol.) ABS 30% B4C 2% W |
|---|---|---|---|
| 0.1 | 96.0% | 85.1% | 85.4% |
| 0.2 | 93.9% | 79.0% | 79.4% |
| 0.3 | 92.1% | 75.2% | 75.8% |
| 0.4 | 90.4% | 72.5% | 73.1% |
| 0.5 | 88.8% | 70.2% | 70.8% |
| 0.6 | 87.2% | 68.2% | 68.9% |
| 0.7 | 85.7% | 66.4% | 67.1% |
| 0.8 | 84.2% | 64.7% | 65.4% |
| 0.9 | 82.8% | 63.1% | 63.9% |
| 1.0 | 81.4% | 61.6% | 62.4% |
| 1.1 | 80.0% | 60.2% | 61.0% |
| 1.2 | 78.6% | 58.8% | 59.6% |
| 1.4 | 75.9% | 56.3% | 57.0% |
| 1.6 | 73.2% | 53.8% | 54.6% |
| 1.8 | 70.6% | 51.6% | 52.3% |
| 2.0 | 68.1% | 49.4% | 50.1% |
| 2.5 | 62.0% | 44.5% | 45.2% |
| 3.0 | 56.3% | 40.2% | 40.7% |
| 3.5 | 51.0% | 36.3% | 36.8% |
| 4.0 | 46.1% | 32.9% | 33.3% |
| 4.5 | 41.6% | 29.7% | 30.1% |
| 5.0 | 37.5% | 26.9% | 27.2% |
| 6.0 | 30.3% | 22.2% | 22.4% |
| 7.0 | 24.3% | 18.3% | 18.4% |
| 8.0 | 19.5% | 15.1% | 15.3% |

TABLE 3

Shielding Results For Photons

| Shielding Thickness (cm) | 60% (vol.) ABS 20% (vol.) B4C 20% (vol.) W | 60% (vol.) ABS 30% (vol.) B4C 10% (vol.) W | 68% (vol.) ABS 30% B4C 2% W |
|---|---|---|---|
| 0.1 | 87.7% | 91.9% | 96.8% |
| 0.2 | 81.4% | 87.2% | 94.9% |
| 0.3 | 76.7% | 83.5% | 93.2% |
| 0.4 | 72.8% | 80.4% | 91.6% |
| 0.5 | 69.4% | 77.7% | 90.1% |
| 0.6 | 66.4% | 75.3% | 88.8% |
| 0.7 | 63.6% | 73.1% | 87.4% |
| 0.8 | 61.0% | 71.0% | 86.2% |
| 0.9 | 58.6% | 69.1% | 85.0% |
| 1.0 | 56.3% | 67.3% | 83.8% |
| 1.1 | 54.1% | 65.5% | 82.7% |
| 1.2 | 52.1% | 63.9% | 81.6% |
| 1.4 | 48.2% | 60.7% | 79.5% |
| 1.6 | 44.8% | 57.8% | 77.6% |
| 1.8 | 41.6% | 55.1% | 75.7% |
| 2.0 | 38.6% | 52.5% | 73.9% |
| 2.5 | 32.2% | 46.7% | 69.7% |
| 3.0 | 26.8% | 41.6% | 65.9% |
| 3.5 | 22.4% | 37.1% | 62.3% |
| 4.0 | 18.7% | 33.1% | 58.9% |
| 4.5 | 15.6% | 29.6% | 55.8% |
| 5.0 | 13.1% | 26.4% | 52.8% |
| 6.0 | 9.2% | 21.0% | 47.3% |
| 7.0 | 6.4% | 16.8% | 42.4% |
| 8.0 | 4.6% | 13.4% | 38.0% |

Tables 4 and 5 below show comparative shielding results for the identified shielding materials herein:

TABLE 4

Shielding Results For Neutrons

| Shielding Thickness (cm) | W at 95% TD | Al-6061 | Ti-Alloy Ti-6Al-4V | 60% ABS 20% B4C 20% W | 60% ABS 30% B4C 10% W | 68% ABS 30% B4C 2% W | SS-316 | 100% ABS | Vermiculite |
|---|---|---|---|---|---|---|---|---|---|
| 0.1 | 95.6% | 99.2% | 97.9% | 96.0% | 85.1% | 85.4% | 96.9% | 98.9% | 98.5% |
| 0.2 | 92.2% | 98.4% | 96.0% | 93.9% | 79.0% | 79.4% | 94.1% | 97.7% | 96.9% |
| 0.3 | 89.2% | 97.7% | 94.2% | 92.1% | 75.2% | 75.8% | 91.4% | 96.6% | 95.4% |
| 0.4 | 86.3% | 97.0% | 92.6% | 90.4% | 72.5% | 73.1% | 88.9% | 95.4% | 93.8% |
| 0.5 | 83.7% | 96.3% | 91.0% | 88.8% | 70.2% | 70.8% | 86.6% | 94.3% | 92.2% |
| 0.6 | 81.2% | 95.6% | 89.6% | 87.2% | 68.2% | 68.9% | 84.4% | 93.1% | 90.7% |
| 0.7 | 78.9% | 94.9% | 88.1% | 85.7% | 66.4% | 67.1% | 82.3% | 92.0% | 89.1% |
| 0.8 | 76.7% | 94.2% | 86.8% | 84.2% | 64.7% | 65.4% | 80.3% | 90.8% | 87.6% |
| 0.9 | 74.6% | 93.6% | 85.5% | 82.8% | 63.1% | 63.9% | 78.4% | 89.7% | 86.1% |
| 1 | 72.7% | 92.9% | 84.2% | 81.4% | 61.6% | 62.4% | 76.6% | 88.6% | 84.7% |
| 1.1 | 70.8% | 92.3% | 83.0% | 80.0% | 60.2% | 61.0% | 74.8% | 87.5% | 83.3% |
| 1.2 | 69.0% | 91.7% | 81.9% | 78.6% | 58.8% | 59.6% | 73.2% | 86.4% | 81.9% |
| 1.4 | 65.7% | 90.5% | 79.7% | 75.9% | 56.3% | 57.0% | 70.1% | 84.3% | 79.2% |
| 1.6 | 62.7% | 89.4% | 77.6% | 73.2% | 53.8% | 54.6% | 67.3% | 82.2% | 76.6% |
| 1.8 | 59.9% | 88.2% | 75.6% | 70.6% | 51.6% | 52.3% | 64.7% | 80.2% | 74.2% |
| 2 | 57.3% | 87.2% | 73.7% | 68.1% | 49.4% | 50.1% | 62.3% | 78.3% | 71.8% |
| 2.5 | 51.7% | 84.6% | 69.4% | 62.0% | 44.5% | 45.2% | 57.1% | 73.8% | 66.5% |
| 3 | 47.0% | 82.2% | 65.6% | 56.3% | 40.2% | 40.7% | 52.7% | 69.7% | 61.7% |
| 3.5 | 43.0% | 80.0% | 62.2% | 51.0% | 36.3% | 36.8% | 49.0% | 65.9% | 57.4% |
| 4 | 39.5% | 77.9% | 59.1% | 46.1% | 32.9% | 33.3% | 45.8% | 62.5% | 53.5% |
| 4.5 | 36.5% | 75.9% | 56.3% | 41.6% | 29.7% | 30.1% | 43.0% | 59.2% | 50.0% |
| 5 | 33.8% | 74.0% | 53.8% | 37.5% | 26.9% | 27.2% | 40.6% | 56.2% | 46.8% |
| 6 | 29.3% | 70.5% | 49.3% | 30.3% | 22.2% | 22.4% | 36.4% | 50.8% | 41.0% |
| 7 | 25.7% | 67.3% | 45.5% | 24.3% | 18.3% | 18.4% | 33.1% | 46.0% | 36.0% |
| 8 | 22.6% | 64.4% | 42.2% | 19.5% | 15.1% | 15.3% | 30.4% | 41.7% | 31.6% |

TABLE 5

Shielding Results For Photons

| Shielding Thickness (cm) | W at 95 TD | Al-6061 | Titanium Alloy Ti-6Al-4V | 60% ABS 20% B4C 20% W | 60% ABS 30% B4C 10% W | 68% ABS 30% B4C 2% W | SS-316 | 100% ABS | Vermiculite |
|---|---|---|---|---|---|---|---|---|---|
| 0.1 | 71.0% | 98.1% | 96.0% | 87.7% | 91.9% | 96.8% | 93.1% | 98.1% | 98.1% |
| 0.2 | 59.0% | 96.9% | 93.9% | 81.4% | 87.2% | 94.9% | 89.4% | 96.9% | 96.8% |
| 0.3 | 50.1% | 95.8% | 92.1% | 76.7% | 83.5% | 93.2% | 86.2% | 95.8% | 95.7% |
| 0.4 | 42.9% | 94.8% | 90.4% | 72.8% | 80.4% | 91.6% | 83.1% | 94.8% | 94.7% |
| 0.5 | 36.8% | 93.9% | 88.8% | 69.4% | 77.7% | 90.1% | 80.2% | 93.9% | 93.7% |
| 0.6 | 31.7% | 92.9% | 87.2% | 66.4% | 75.3% | 88.8% | 77.4% | 92.9% | 92.8% |
| 0.7 | 27.3% | 92.1% | 85.7% | 63.6% | 73.1% | 87.4% | 74.7% | 92.1% | 91.9% |
| 0.8 | 23.6% | 91.2% | 84.2% | 61.0% | 71.0% | 86.2% | 72.1% | 91.2% | 91.1% |
| 0.9 | 20.3% | 90.4% | 82.8% | 58.6% | 69.1% | 85.0% | 69.6% | 90.4% | 90.2% |
| 1 | 17.6% | 89.5% | 81.4% | 56.3% | 67.3% | 83.8% | 67.1% | 89.5% | 89.4% |
| 1.1 | 15.2% | 88.7% | 80.0% | 54.1% | 65.5% | 82.7% | 64.7% | 88.7% | 88.6% |
| 1.2 | 13.2% | 87.9% | 78.6% | 52.1% | 63.9% | 81.6% | 62.3% | 87.9% | 87.7% |
| 1.4 | 9.9% | 86.3% | 75.9% | 48.2% | 60.7% | 79.5% | 57.9% | 86.3% | 86.1% |
| 1.6 | 7.4% | 84.7% | 73.2% | 44.8% | 57.8% | 77.6% | 53.7% | 84.7% | 84.6% |
| 1.8 | 5.6% | 83.2% | 70.6% | 41.6% | 55.1% | 75.7% | 49.7% | 83.2% | 83.0% |
| 2 | 4.3% | 81.7% | 68.1% | 38.6% | 52.5% | 73.9% | 46.0% | 81.7% | 81.5% |
| 2.5 | 2.2% | 78.0% | 62.0% | 32.2% | 46.7% | 69.7% | 37.8% | 78.0% | 77.8% |
| 3 | 1.2% | 74.4% | 56.3% | 26.8% | 41.6% | 65.9% | 30.9% | 74.4% | 74.1% |
| 3.5 | 0.6% | 70.8% | 51.0% | 22.4% | 37.1% | 62.3% | 25.1% | 70.8% | 70.6% |
| 4 | 0.4% | 67.3% | 46.1% | 18.7% | 33.1% | 58.9% | 20.4% | 67.3% | 67.1% |
| 4.5 | 0.2% | 64.0% | 41.6% | 15.6% | 29.6% | 55.8% | 16.5% | 64.0% | 63.7% |
| 5 | 0.12% | 60.6% | 37.5% | 13.1% | 26.4% | 52.8% | 13.3% | 60.6% | 60.4% |
| 6 | 0.05% | 54.3% | 30.3% | 9.2% | 21.0% | 47.3% | 8.6% | 54.3% | 54.0% |
| 7 | 0.02% | 48.4% | 24.3% | 6.4% | 16.8% | 42.4% | 5.5% | 48.4% | 48.2% |
| 8 | 0.01% | 42.9% | 19.5% | 4.6% | 13.4% | 38.0% | 3.5% | 42.9% | 42.7% |

As can therefore be seen from Tables 2 and 3, additive manufacturing of a resin component in combination with $B_4C$ and a selected metal (W, Pb, Sn or Sb) provides shielding from both neutrons and photons, which shield improves upon thickening of the component and depending upon the relative amount of $B_4C$ and W that may be included in the formulation. The thickness may preferably be in the range of 0.1 cm to 8.0 cm. In particular, an increase in the relative amounts of $B_4C$ will tend to serve to reduce the percentage of neutron based radiation that survives after such radiation emits through the shielding. In addition, an increase in the relative amount of the metal component will tend to serve to reduce the percentage of photon based radiation that emits through the shielding. Accordingly, one may now select particular levels of $B_4C$ and W to optimize neutron based or photon based radiation respectively in commercial nuclear fuel radiation environments.

For example, at a thickness of about 1.0 cm or higher, the formulations herein are such that the percentage of radiation that survives after radiation emits through the shielding can be configured, in the case of neutron radiation, to be 60% or lower, and in the case of photon radiation, at 55% or lower. At a thickness of about 2.0 cm or higher, the percentage of radiation that survives after radiation emits through the shielding can be configured, in the case of neutron radiation, to be at 50% or lower, and in the case of photon radiation, at 40% or lower. At a thickness of about 3.0 cm or higher, the percentage of radiation that survives after radiation emits through the shielding can be configured, in the case of neutron radiation, to be at 41% or lower, and in the case of photon radiation, at 27% or lower. Accordingly, the present invention provides an additive manufactured component that may preferably, at a thickness between 0.1 cm to 8.0 cm, or at a preferred thickness of 0.1 cm to 3.0 cm, provide useful shielding against photon based or neutron based radiation.

Figure 2:
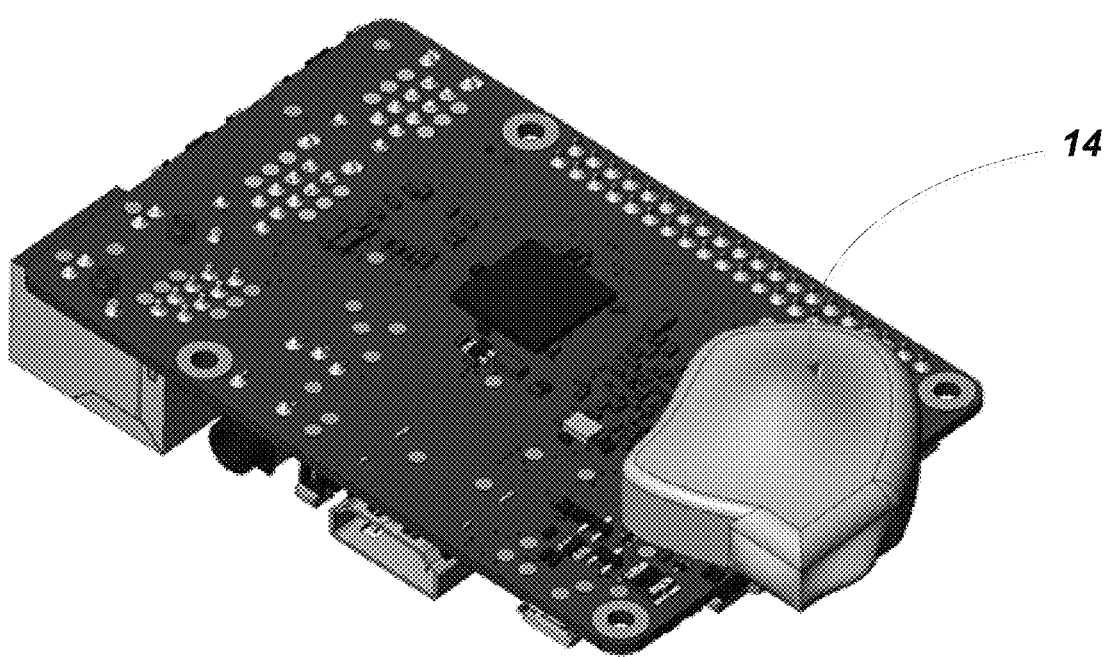
FIG. 2 illustrates an additive manufacturing protective shield selectively located to protect the memory card from the damaging effects of radiation.

Attention is next directed to FIGS. 1 and 2 which illustrates one utility for the present invention. As illustrated in FIG. 1, an example printed circuit board 10 is shown that may be used, e.g., within a remote sensing device, such as a drone, and which contains as a critical component, a secure digital (SD) memory card 12 that is particularly susceptible to the effects of radiation. As shown in FIG. 2, such memory card may now be provided with an additive manufacture protective shield 14 with a desired and relatively complex form factor to protect the memory card from the otherwise damaging effects of radiation. Such complex form factor offers reduction in weight over the use of a radiation hardening enclosure that would typically cover and/or encase the entire circuit board construction.

The application of the additive manufactured shielding composition herein may therefore be preferably applied, as noted, for shielding equipment and associated electronics. In particular, as alluded to herein, the shielding herein may be preferably positioned at selected locations and in selected size (form factor) and thickness on nuclear facility decommissioning equipment, surveillance robots and unmanned systems (crawlers, drones and submersibles). Crawlers are reference to a robotic vehicle that mobilize along the ground or other similar surface, a drone is reference to an unmanned flying vehicle, and a submersible is reference to an unmanned vehicle that travels under water. Furthermore, the shielding herein is contemplated to include spot shielding, where, e.g., selected locations on a given circuit board may now be shielded as opposed to the traditional use of a radiation hardening enclosure that would otherwise encase an entire circuit board and provide both an undesirable form factor and weight factor.

The AM products herein thus provide several benefits that make them attractive in various industries. As noted, the ability to jointly attenuate the effects of photon and neutron based radiation, in selected form factors, can now be readily produced and significantly remove the disadvantages of hardening enclosures. In addition, using additive manufacturing and the formulations herein, the selected form factors can be readily produced in relative short time periods.

Numerous other variations and configurations will be apparent from those skilled in the art and the examples and preferred embodiments herein are presented for illustrative purposes and not to be construed as limiting in any manner.

What is claimed is:

1. A method for making a radiation shielding component comprising:
    providing a resin material;
    providing a metal selected from W, Pb, Sn or Sb;
    providing $B_4C$;
    combining said resin, metal and $B_4C$ and depositing successive layers in a 3D printer to form an additively manufactured component wherein said component provides shielding for both neutron and photon based radiation.

2. The method of claim 1 wherein said resin comprises a thermoplastic material.

3. The method of claim 1 wherein said resin comprises acrylonitrile-butadiene-styrene terpolymer (ABS), polycarbonate (PC), poly(methyl methacrylate), polyphenylene sulfone (PPSU), polyethylene, polyetherimide (PEI), polyether ether ketone (PEEK) or polystyrene.

4. The method of claim 1 wherein said metal is W and said 3D printed product has a thickness of 0.1 cm to 8.0 cm.

5. The method of claim 1 wherein said metal is W present at a level of 1% (vol.) to 30% (vol.), $B_4C$ is present at a level of 10% (vol.) to 40% (vol.) and said resin is present at a level of 50% (vol.) to 80% (vol.).

6. The method of claim 1 wherein said metal is W present at a level of 2% (vol.) to 20% (vol.) and $B_4C$ is present at a level of 15% (vol.) to 35% (vol.).

7. The method of claim 1 wherein said metal is W present at a level of 2% (vol.) to 20% (vol.) and $B_4C$ is present at a level of 20% (vol.) to 30% (vol.).

8. The method of claim 1 wherein said additively manufactured component has a thickness of 1.0 cm or higher and the percentage of radiation that survives after radiation emits through said component in the case of neutron radiation is 60% or lower and the case of photon radiation, is 55% or lower.

9. The method of claim 1 wherein said component is positioned within a robot.

10. The method of claim 1 wherein said component is positioned within a crawler, drone or submersible vehicle.

11. A method for making a radiation shielding component comprising:
    providing acrylonitrile-butadiene-styrene material;
    providing a metal selected from W, Pb, Sn or Sb;
    providing $B_4C$;
    combining said metal and $B_4C$ and depositing successive layers in a 3D printer to form an additively manufactured component at a thickness of 0.1 cm to 8.0 cm, wherein said acrylonitrile-butadiene-styrene material is present at a level of 50% (vol.) to 80% (vol.), said metal is present at a level of 1% (vol.) to 30% (vol.), $B_4C$ is present at a level of 10% (vol.) to 40% (vol.), wherein said component provides shielding for both neutron and photon based radiation.

12. The method of claim 11 wherein said metal is W present at a level of 2% (vol.) to 20% (vol.) and $B_4C$ is present at a level of 15% (vol.) to 35% (vol.).

13. The method of claim 11 wherein said metal is W present at a level of 2% (vol.) to 20% (vol.) and $B_4C$ is present at a level of 20% (vol.) to 30% (vol.).

14. The method of claim 11 wherein said component has a thickness of 1.0 cm or higher and the percentage of radiation that survives after radiation emits through said 3D printed component in the case of neutron radiation is 60% or lower and the case of photon radiation, is 55% or lower.

15. The method of claim 11 wherein said component is positioned within a robot.

16. The method of claim 11 wherein said component is positioned within a crawler, drone or submersible vehicle.

* * * * *